United States Patent
Graf et al.

(10) Patent No.: US 11,668,753 B2
(45) Date of Patent: Jun. 6, 2023

(54) CONTACT MEASUREMENT SYSTEM AND METHOD FOR MEASURING A PARAMETER OF A CONTACT OF A SWITCHGEAR

(71) Applicant: ABB Schweiz AG, Baden (CH)

(72) Inventors: Alexander Graf, Mannheim (DE); Stefan Wildermuth, Laudenbach (DE); Holger Reutner, Eppelheim (DE); Thomas Stahl, Spechbach (DE); Sebastian Breisch, Neckarsteinach (DE); Simon Penner, Osthofen (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/355,211

(22) Filed: Jun. 23, 2021

(65) Prior Publication Data

US 2021/0405115 A1  Dec. 30, 2021

(30) Foreign Application Priority Data

Jun. 25, 2020  (EP) .................................... 20182201

(51) Int. Cl.
    *G01R 31/327*  (2006.01)
(52) U.S. Cl.
    CPC ................ *G01R 31/3274* (2013.01)
(58) Field of Classification Search
    None
    See application file for complete search history.

(56) References Cited

U.S. PATENT DOCUMENTS

| | | | | |
|---|---|---|---|---|
| 8,264,232 | B2 * | 9/2012 | Rival | .................. H01H 1/0015 |
| | | | | 324/424 |
| 2012/0194208 | A1 * | 8/2012 | Lamson | ............. G01R 31/2848 |
| | | | | 324/750.01 |

(Continued)

FOREIGN PATENT DOCUMENTS

| | | |
|---|---|---|
| EP | 3073049 A1 | 9/2016 |
| GB | 2465068 A | 5/2010 |

(Continued)

OTHER PUBLICATIONS

Meinherz et al.; Monitoring Method for a Separation Path of an Electric Switching Device, Which is Defined by Contact Pieces Which Can Be Displaced in Relation to Each Other, and Associated Device for Carrying out Said Monitoring Method; Siemens AG; WO2006048381A1; May 11, 2006; H01H11/00 (Year: 2006).*

(Continued)

*Primary Examiner* — Nasima Monsur
(74) *Attorney, Agent, or Firm* — Leydig, Voit & Mayer, Ltd.

(57) ABSTRACT

A contact measurement system for measuring a parameter of a contact of a switchgear includes: a first device for measuring an electrical resistance of the contact and mapping the electrical resistance spatially and/or dynamically; a second device for measuring an axial force of the contact and to map the axial force spatially and/or dynamically as a measured axial force; and a third device for measuring a position of the contact. The contact measurement system determines a position-depending force characteristic based on the measured axial force of the contact and the position of the contact. The contact measurement system determines a status of the contact based on a combination of the position-depending force characteristic with the electrical resistance of the contact.

10 Claims, 5 Drawing Sheets

(56) References Cited

U.S. PATENT DOCUMENTS

2015/0096874 A1 4/2015 Dedina
2018/0076573 A1* 3/2018 Walton ................ E21B 41/0007

FOREIGN PATENT DOCUMENTS

JP     WO2013094354 A1     4/2015
WO    WO 2006048381 A1    5/2006

OTHER PUBLICATIONS

Xiangyu Guan et al. ; Finite Element Analysis on Forces, currents, and magnetic fluxes of misaligned GIS disconnector; IEEE Transaction on Power Delivery vol. 33 No. 5 Oct. 2018. (Year: 2018).*
Guan Xiangyu et al., "Finite Element 1-12 Analysis on Forces, Currents, and Magnetic Fluxes of Misaligned GIS Disconnector," IEEE Transactions on Power Delivery, Oct. 2018, pp. 2484-2490, vol. 33, No. 5, IEEE Service Center, New York, NY, U.S.A.

* cited by examiner

CONTACT MEASUREMENT SYSTEM AND METHOD FOR MEASURING A PARAMETER OF A CONTACT OF A SWITCHGEAR

CROSS-REFERENCE TO PRIOR APPLICATION

Priority is claimed to European Patent Application No. EP 20 182 201.2, filed on Jun. 25, 2020, the entire disclosure of which is hereby incorporated by reference herein.

FIELD

The present invention relates a test device for inspection tasks of female contacts in LV switchgears. In particular, the present invention relates to a contact measurement system and method for measuring a parameter of a contact of a switchgear

BACKGROUND

As the female and male contacts of a switchgear are prone to electrical and mechanical wear, it is required to inspect them in planned service intervals. Therefore, a testing method is required to deduce the contact condition.

Mainly the female contact needs to be inspected as this contact includes a lamella which ensures good electrical conduction.

Two main parameters of interest are:

The electrical resistance as well as the contact force. Too high electrical resistance will lead to electrical loss and excessive heat generation. A low contact force will lead to a poor contact performance during short circuit events as the high forces during such an event may lead to physical separation of the contact, thus leading to arcing.

As a secondary effect of too low contact force is an increase of contact resistance. There is a need to address these issues.

SUMMARY

In an embodiment, the present invention provides a contact measurement system for measuring a parameter of a contact of a switchgear, comprising: a first device configured to measure an electrical resistance of the contact and to map the electrical resistance spatially and/or dynamically; a second device configured to measure an axial force of the contact and to map the axial force spatially and/or dynamically as a measured axial force; and a third device configured to measure a position of the contact, wherein the contact measurement system is configured to determine a position-depending force characteristic based on the measured axial force of the contact and the position of the contact, and wherein the contact measurement system is configured to determine a status of the contact based on a combination of the position-depending force characteristic with the electrical resistance of the contact.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
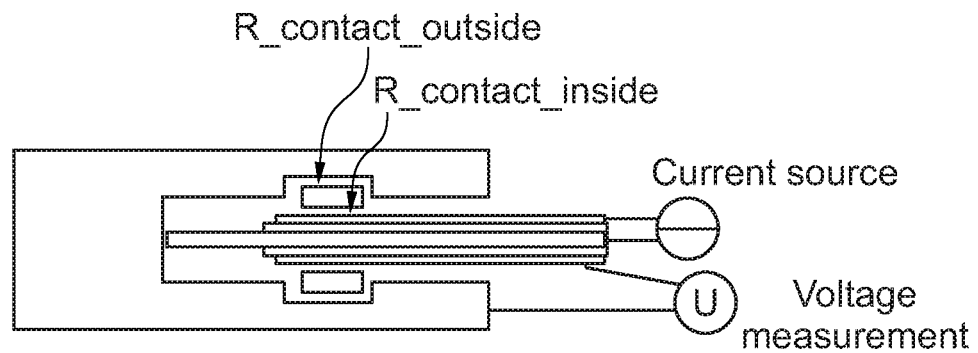
FIG. 1 shows a schematic illustration of a concept of 4 point measurement according to an exemplary embodiment of the present invention.

In an embodiment, the present invention provides an improved technique to measure the contacts of a switchgear.

In a first aspect, there is provided a contact measurement system for measuring a parameter of a contact of a switchgear, comprising a first device configured to measure an electrical resistance of the contact and to map the electrical resistance spatially and/or dynamically; a second device configured to measure an axial force of the contact and to map the axial force spatially and/or dynamically; and a third device configured to measure a position of the contact; wherein the contact measurement system is configured to determine a position-depending force characteristic based on the measured axial force of the contact and the position of the contact; wherein the contact measurement system is configured to determine a status of the contact based on a combination of the position-depending force characteristic with the electrical resistance of the contact.

In this manner a test device is provided that enables that although according to the state-of-the-art the contact condition is monitored by measuring the peak sliding force when withdrawing the male contact from the connection and improved measurement is enabled. The condition of any contact can be defined by three separate measurements: Visual inspection, resistance measurements and contact force measurement. The present measurement system allows for an integrated and thereby combined measurement of electrical resistance, axial force and position.

In this manner a test device is provided that enables measurements for contact quality: combine measurement of sliding force in relation to position with measurement of electrical resistance.

The present invention enables to give an indication of contact quality; lubrication, ageing and contamination due to site conditions has effect on the contact quality and the effect of lubrication, ageing and contamination due to site conditions on contact quality will be recognized by combining measurement of sliding force in relation to position with measurement of electrical resistance.

Thereby a position depending force characteristic can be derived. The combination of resistance and force/position characteristics allows for a suitable on-site inspection of the lamella and a general status of the present condition.

The solution proposed also maps the contact forces (sliding force or radial force) dynamically, i.e. versus position while inserting and/or withdrawing a male test pin.

The test pin resembles the pin used in a medium voltage switchgear but may have adoptions to support the measurement. The performance of the contact during operation is mainly determined by the radial force.

In a second aspect, there is provided a method is disclosed which allows to extract various information on the contact condition from this dynamic measurement.

The second aspect of the present invention relates to a contact measurement method for measuring a parameter of a contact of a switchgear, the method comprising the steps of: measuring an electrical resistance of the contact and mapping the electrical resistance spatially and/or dynamically by means of a first device; measuring an axial force of the contact and to map the axial force spatially and/or dynamically by means of a second device; and measuring a position of the contact by means of third device; wherein the method further comprising the step of determining a position-depending force characteristic based on the measured axial force of the contact and the position of the contact; wherein the method further comprising the step of determining a status of the contact based on a combination of the position-depending force characteristic with the electrical resistance of the contact.

In an example, this method may be combined with a measurement of contact resistance.

To provide an electrical current flow conventionally two bodies are mechanically joined. In some applications dedicated lamellas are built-in to provide a good electrical contact. Depending on e.g. switching cycles, current transfer duration, overcurrent's by external malfunctions such as short circuits these lamellas might be worn or damaged.

In other words, the present invention on is about a test method to deduce the condition of such a female electrical contact e.g. with lamella contact.

In an exemplary embodiment of the present invention, the contact measurement system is configured to scan a surface of the switch gear.

In an exemplary embodiment of the present invention, the contact is a female or a male contact.

In an exemplary embodiment of the present invention, the contact is measured on a built-in component of the switchgear.

In an exemplary embodiment of the present invention, the contact measurement system is portable.

In an exemplary embodiment of the present invention, the contact measurement system is non-portable.

In an exemplary embodiment of the present invention, the contact measurement system comprises a hollow surrounding shaft, that contains an electrical isolated pin and which is used by the first device for measuring the electrical resistance of the contact.

In an exemplary embodiment of the present invention, the first device for measuring the electrical resistance comprises a 4-point measurement setup.

In an exemplary embodiment of the present invention, the first device for measuring the electrical resistance comprises a 3-point measurement setup.

In an exemplary embodiment of the present invention, the first device is configured to perform a measurement of the electrical resistance by connecting a voltage measurement in any location of an electrical path of a withdrawable module.

In an exemplary embodiment of the present invention, the third device configured to be switched-off in a suspend mode and wherein the contact measurement system is configured to determine a force characteristic based on the measured axial force of the contact; wherein the contact measurement system is configured to determine a status of the contact based on a combination of force characteristic with the electrical resistance of the contact.

The above aspects and examples will become apparent from and be elucidated with reference to the embodiments described hereinafter.

FIG. 1 shows the general schematic of the developed test device according to an exemplary embodiment of the present invention. The test device may comprise a hollow surrounding shaft that contains an electrical isolated pin. The red component in the schematic is the component of interest.

With a 4-point measurement setup, the resistance of the red device can directly be measured. The mid pin is spring loaded to provide a sufficiently good current transfer to the female contact. Alternatively, a 3-point measurement may be used as the electrical connection of current source and voltage measurement to the pin can be defined during construction of the test device.

Figure 2:
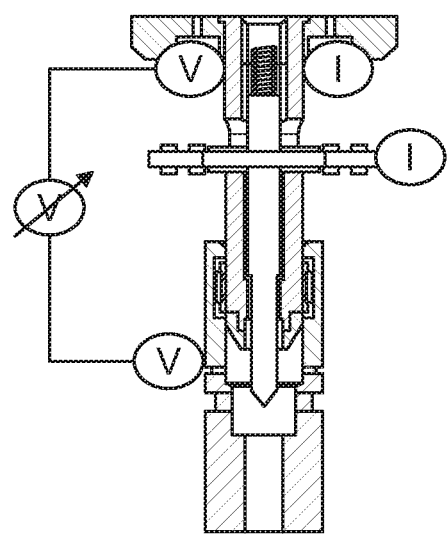
FIG. 2 shows an example of a 4-point measurement setup on outside according to an exemplary embodiment of the present invention.

For the voltage measurement on the female contact (blue component in FIG. 1) several alternative options can be used:

Measurement on the outside of the female contact are shown in FIG. 2 according to an exemplary embodiment of the present invention. A modification to the insulating cover of the female contact would be required in this case.

FIG. 2 shows an example of a 4-point measurement setup on outside according to an exemplary embodiment of the present invention.

In an exemplary embodiment, the voltage measurement may also be performed using the middle pin as shown in FIG. 2.

Measurement on the LV switchgear installation which is not shown in FIG. 1. The advantage would be simple access without need to modify the insulating cover FIG. 3 shows an example of a 4-point measurement on tip according to an exemplary embodiment of the present invention.

Figure 3:
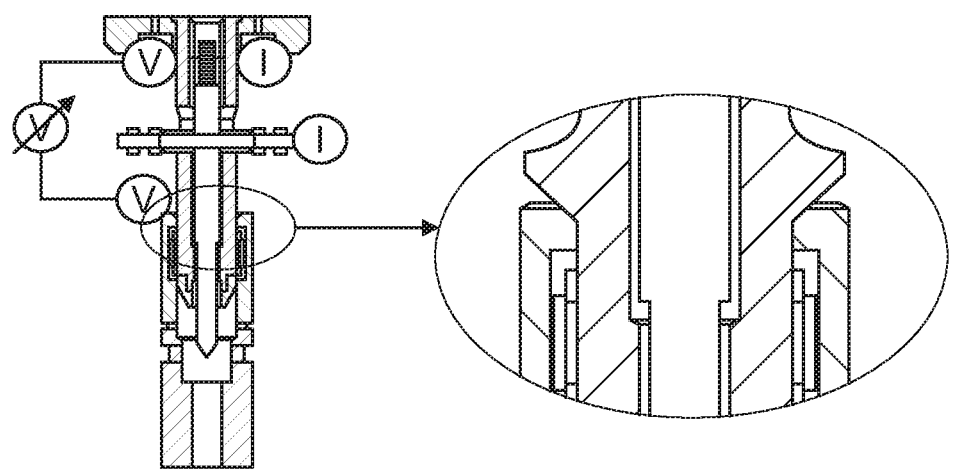
FIG. 3 shows an example of a 4-point measurement on tip according to an exemplary embodiment of the present invention.

Measurement on the tip of the female contact are shown in FIG. 3 according to an exemplary embodiment of the present invention. A dedicated surface on the male contact would be required in this case.

Figure 4:
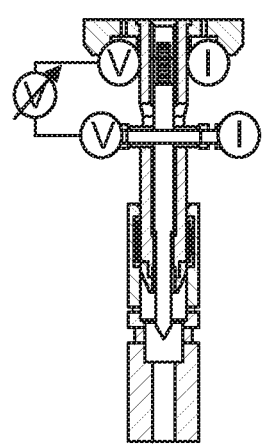
FIG. 4 shows an example of a 4-point measurement setup according to an exemplary embodiment of the present invention.

FIG. 4 shows an example of a 4-point measurement setup according to an exemplary embodiment of the present invention.

Measurement by a third electrical pin running within the pin are shown in FIG. 4 according to an exemplary embodiment of the present invention.

Figure 5:
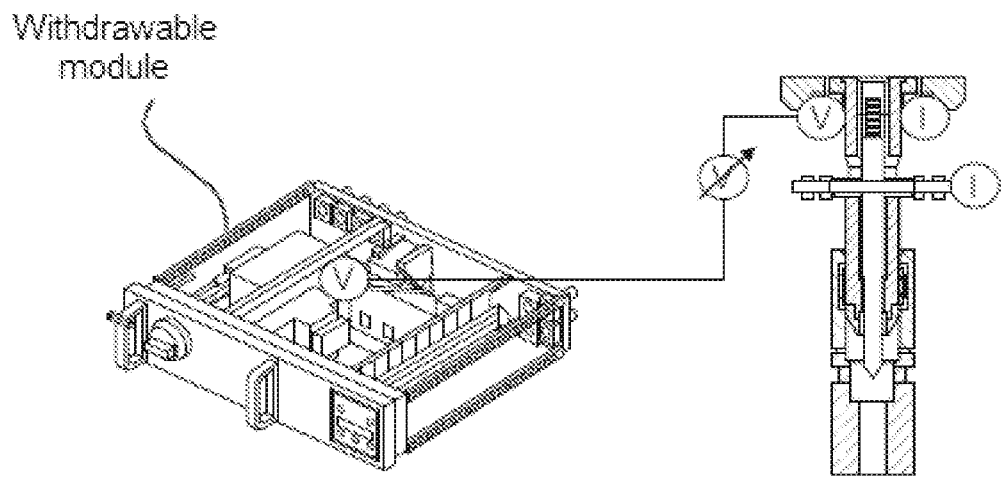
FIG. 5 shows an example of a 4-point measurement setup in any location according to an exemplary embodiment of the present invention according to an exemplary embodiment of the present invention.

FIG. 5 shows an example of a 4-point measurement setup in any location according to an exemplary embodiment of the present invention according to an exemplary embodiment of the present invention.

Measurement by connecting the voltage measurement in any location of the electrical path of the withdrawable module. Ideally the electrical connection will be accessible from front of the withdrawable module FIG. 5.

As a second physical measure the axial (sliding) force while insertion or pull-out is of interest. Therefore, the entire device is in-line with a force sensor and a position sensor which enables a force vs. position measurement.

Figure 6:
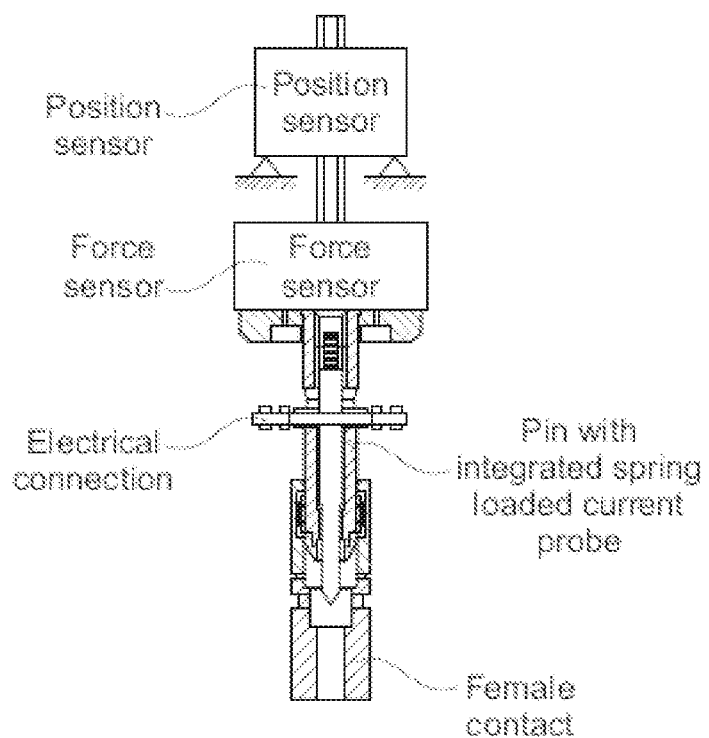
FIG. 6 shows an example of a sectional view of test device according to an exemplary embodiment of the present invention.

FIG. 6 shows an example of a sectional view of test device according to an exemplary embodiment of the present invention.

Figure 7:
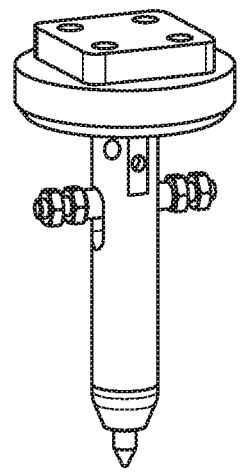
FIG. 7 shows an example of a test device according to an exemplary embodiment of the present invention.

FIG. 7 shows an example of a test device according to an exemplary embodiment of the present invention.

To allow for an in-line assembly, the spring loaded current probe is T-shaped, so that the required electrical connection can be done. FIG. 7 shows the CAD model of the test device.

Figure 8:
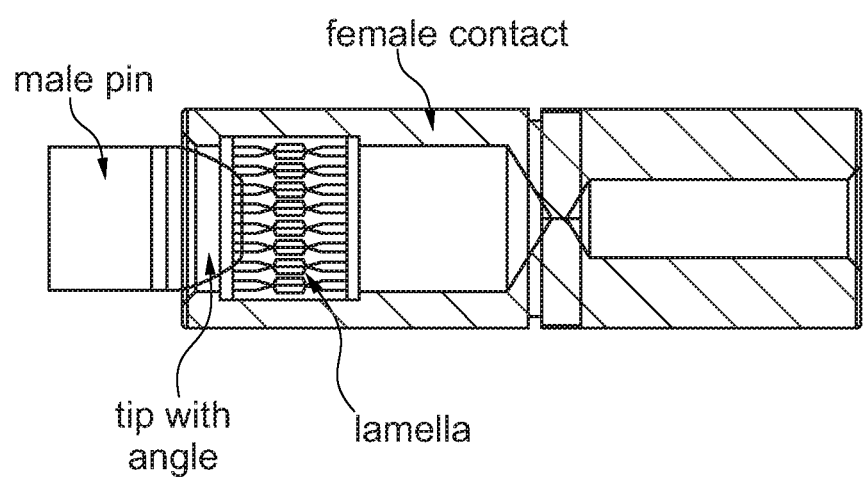
FIG. 8 shows an overview of an example of a contact device according to an exemplary embodiment of the present invention.

FIG. 8 shows an overview of an example of a contact device according to an exemplary embodiment of the present invention.

FIG. 8 gives an overview of the contact device, including male pin and its tip, the contact lamella and the female contact part.

Figure 9:
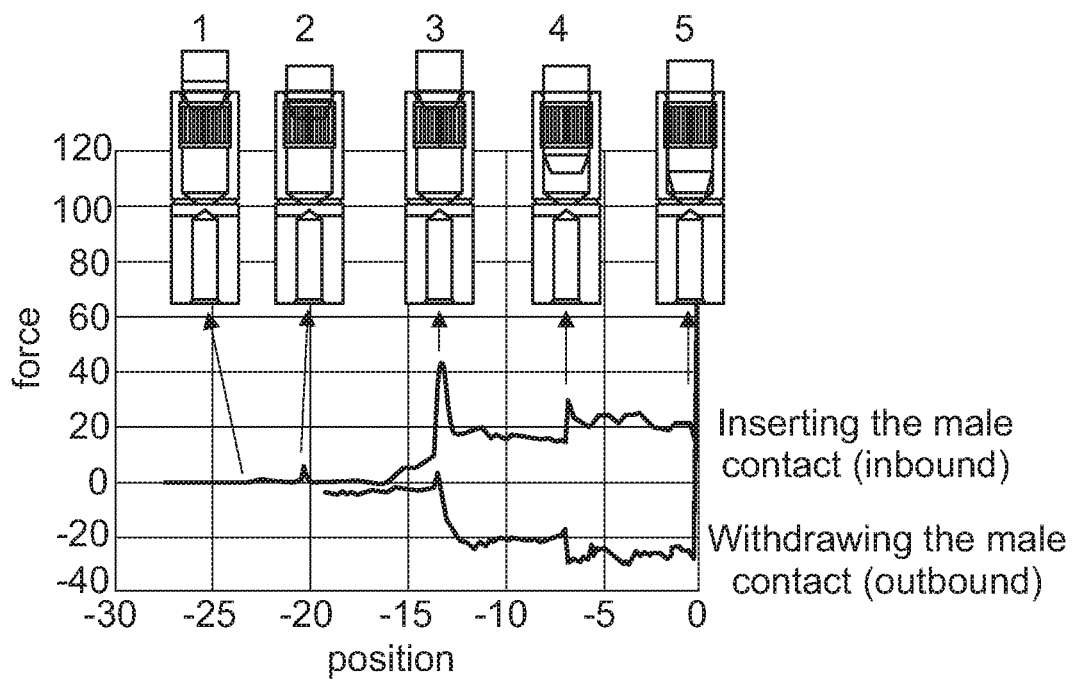
FIG. 9 shows an example of a diagram of force over position according to an exemplary embodiment of the present invention.

FIG. 9 shows an example of a diagram of force over position according to an exemplary embodiment of the present invention.

FIG. 9 shows various positions.

Position 1: Male pin is outside of the female contact

Position 2: Tip of the male pin starts to enter the female contact

Position 3: Male pin enters the lamella. High force is required to deform the lamella at the beginning.

After this initial deformation the sliding force levels on a lower value.

Position 4: Mal pin enters the lower part of the female contact and gets centered.

Position 5: Male pin comes in direct contact to the female contact and movement gets stopped.

Figure 10:
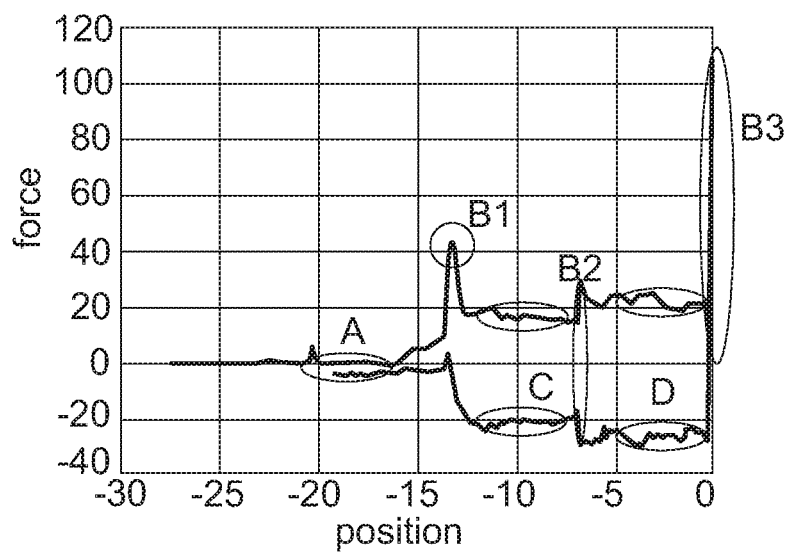
FIG. 10 shows various areas of the sliding force vs. position curve several information according to an exemplary embodiment of the present invention.

FIG. 10 shows various areas of the sliding force vs. position curve several information according to an exemplary embodiment of the present invention.

FIG. 10 gives an example for area analysis.

FIG. 10 gives an example for determination and identification of different positions:

Area A: The measurement of the forces on the inbound and outbound section need to be equal and can be used to define the zero level of the sliding force. A deviation in the inbound and outbound force measurement indicates a drift of the force sensor used for force measurement. Thus, it can be used to check the quality of the measurement. Furthermore, this information may be used to compensate the drift.

Area B: The maximum force on the inbound section precisely defines the starting location of the lamella (Area B1) and the end location of the lamella (Area B2). From the stopping position the depth of the contact may be determined (Area B3). This information about the physical dimensions of the contact may be used to identify the contact type and additional specifications.

Area B1: At this position the male pin enters the lamella and deforms the lamella. Therefore, the radial force $F_r$ can be extracted from this measurement if an appropriate model is used which contains the velocity, dimensional parameters of the tip of the male pin as well as the material parameters of the male pin's tip.

Area C: The sliding force can be deduced from this measurement section. Comparison of data from Area C and Area D may be used to determine if the male contact is well centered. Here only single mechanical guidance which is located before the lamella.

Area D: The sliding force can be deduced from the measurement section. Comparison of data from Area C and Area D may be used to determine if the male contact is well centered. Here double mechanical guidance which are located before and behind the lamella.

The curves measured in section C and D on the inbound and outbound section may be further analyzed. The mean value is an indication of contact force and the fluctuation is a measure for contact roughness. In general, the sliding force and radial force are connected via the coefficient of friction $\mu$, according to $F_s = \mu F_r$. The contacting surfaces are both metallic.

During the above measurement at least one measurement of the electrical contact resistance can be performed. The information from the force vs. position measurement can be used to trigger the contact resistance measurement(s). More than one contact resistance measurement may be done to achieve higher statistics or to measure the contact resistance at a certain contact force.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A contact measurement system for measuring a parameter of a contact of a switchgear, comprising:
    a first device configured to measure an electrical resistance of the contact and to map the electrical resistance spatially and/or dynamically;
    a second device configured to measure an axial force of the contact and to map the axial force spatially and/or dynamically as a measured axial force; and
    a third device configured to measure a position of the contact,
    wherein the contact measurement system is configured to determine a position-depending force characteristic based on the measured axial force of the contact and the position of the contact,
    wherein the contact measurement system is configured to determine a status of the contact based on a combination of the position-depending force characteristic with the electrical resistance of the contact using position-dependent resistance measurements and contact force measurement, wherein the first device configured to measure the electrical resistance comprises a 4-point measurement setup, and wherein the third device configured to measure the position of the contact is configured to be switched-off in a suspend mode, wherein the contact measurement system is configured to determine a force characteristic based on the measured axial force of the contact, and wherein the contact measurement system is configured to determine a status of the contact based on a combination of force characteristic with the electrical resistance of the contact.

2. The contact measurement system of claim 1, wherein the contact measurement system is configured to scan a surface of the switchgear.

3. The contact measurement system of claim 1, wherein the contact comprises a female contact or a male contact.

4. The contact measurement system of claim 1, wherein the contact comprises a built-in component of the switchgear.

5. The contact measurement system of claim 1, wherein the contact measurement system is portable.

6. The contact measurement system of claim 1, wherein the contact measurement system is non-portable.

7. The contact measurement system of claim 1, further comprising:

a hollow surrounding shaft that contains an electrical isolated pin and which is used by the first device configured to measure the electrical resistance of the contact.

8. The contact measurement system of claim 1, wherein the first device configured to measure the electrical resistance comprises a 3-point measurement setup.

9. The contact measurement system of claim 1, wherein the first device configured to measure the electrical resistance is configured to perform a measurement of the electrical resistance by connecting a voltage measurement in any location of an electrical path of a withdrawable module.

10. A contact measurement method for measuring a parameter of a contact of a switchgear, comprising:

measuring an electrical resistance of the contact and mapping the electrical resistance spatially and/or dynamically by a first device;

measuring an axial force of the contact and mapping the axial force spatially and/or dynamically by a second device as a measured axial force;

determining a position-depending force characteristic based on the measured axial force of the contact and the position of the contact; and wherein the method further comprises determining a status of the contact based on a combination of the position-depending force characteristic with the electrical resistance of the contact using position-dependent resistance measurements and contact force measurement, wherein the first device configured to measure the electrical resistance comprises a 4-point measurement setup, and wherein the third device configured to measure the position of the contact is configured to be switched-off in a suspend mode, wherein the contact measurement system is configured to determine a force characteristic based on the measured axial force of the contact, and wherein the contact measurement system is configured to determine a status of the contact based on a combination of force characteristic with the electrical resistance of the contact.

* * * * *